US 8,306,173 B2

(12) United States Patent  (10) Patent No.: US 8,306,173 B2
Yanagidate  (45) Date of Patent: Nov. 6, 2012

(54) CLOCK REGENERATION CIRCUIT

(75) Inventor: Masaharu Yanagidate, Sagamihara (JP)

(73) Assignee: Olympus Corporation, Tokyo (JP)

( * ) Notice: Subject to any disclaimer, the term of this patent is extended or adjusted under 35 U.S.C. 154(b) by 903 days.

(21) Appl. No.: 12/391,568

(22) Filed: Feb. 24, 2009

(65) Prior Publication Data
US 2009/0213973 A1  Aug. 27, 2009

(30) Foreign Application Priority Data
Feb. 26, 2008 (JP) ................. 2008-044414

(51) Int. Cl.
H04L 7/00 (2006.01)
(52) U.S. Cl. ........ 375/371; 375/354; 375/373; 375/226; 375/360; 375/375; 455/421
(58) Field of Classification Search .......... 375/371, 375/354, 373, 226, 360, 375; 455/421
See application file for complete search history.

(56) References Cited

U.S. PATENT DOCUMENTS

| | | | |
|---|---|---|---|
| 5,220,581 A | 6/1993 | Ferraiolo et al. | |
| 5,245,637 A | 9/1993 | Gersbach et al. | |
| 5,371,766 A | 12/1994 | Gersbach et al. | |
| 6,208,701 B1 | 3/2001 | Hiramatsu et al. | |
| 6,456,677 B1 | 9/2002 | Hiramatsu et al. | |
| 6,584,163 B1 * | 6/2003 | Myers et al. | 375/360 |

FOREIGN PATENT DOCUMENTS

| | | |
|---|---|---|
| JP | 63-185136 A | 7/1988 |
| JP | 06-303224 A | 10/1994 |
| JP | 10-215289 A | 8/1998 |
| JP | 10-327136 A | 12/1998 |
| JP | 11-163845 A | 6/1999 |
| JP | 2004-015112 A | 1/2004 |

OTHER PUBLICATIONS

Partial European Search Report dated May 6, 2011, issued in corresponding European Patent Application No. 09002585.9.
Japanese Office Action dated Aug. 14, 2012, issued in corresponding Japanese Patent Application No. 2008-044414, w/ English translation.

* cited by examiner

Primary Examiner — Zewdu Kassa
(74) Attorney, Agent, or Firm — Westerman, Hattori, Daniels & Adrian, LLP

(57) ABSTRACT

A clock regeneration circuit according to the present invention that generates a clock signal that is synchronized to an input signal, includes: a detection section which detects points at which the input signal transitions; a histogram generation section which associates a plurality of partial periods with the transition points, and generates a first histogram indicating an incidence of the transition points for each of the partial periods, the partial periods being generated by dividing a reference period of the clock signal; a calculation processing section which generates a second histogram by calculation processing based on the first histogram, and calculates a phase adjustment value of the clock signal based on the second histogram; and a phase adjustment section which adjusts a phase of the clock signal based on the phase adjustment value.

21 Claims, 12 Drawing Sheets

FIG. 6
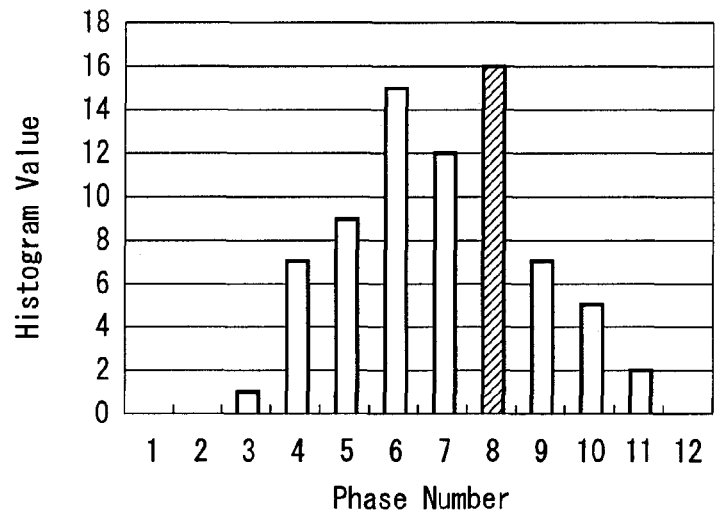
FIG. 7
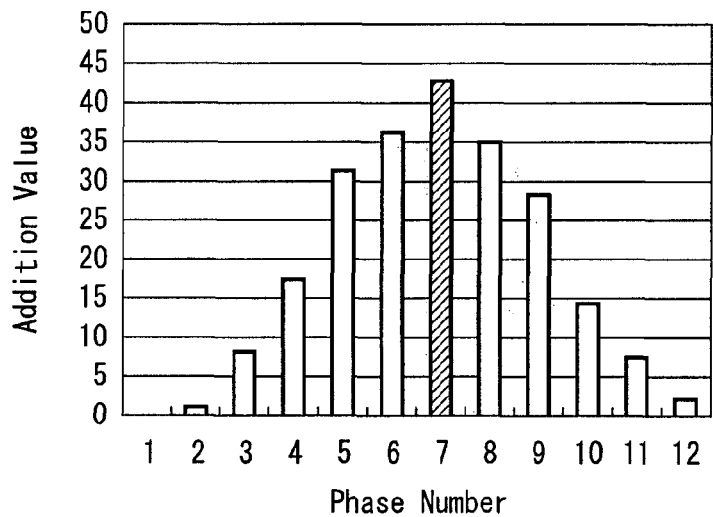
FIG. 8
| Phase | 1 | 2 | 3 | 4 | 5 | 6 | 7 | 8 | 9 | 10 | 11 | 12 |
|---:|---|---|---|---|---|---|---|---|---|---|---|---|
| Histogram Value | 0 | 0 | 1 | 7 | 9 | 15 | 12 | 16 | 7 | 5 | 2 | 0 |
| Addition Value | 0 | 1 | 8 | 17 | 31 | 36 | 43 | 35 | 28 | 14 | 7 | 2 |

FIG. 13
| Phase | 1 | 2 | 3 | 4 | 5 | 6 | 7 | 8 | 9 | 10 | 11 | 12 |
|---|---|---|---|---|---|---|---|---|---|---|---|---|
| Histogram Value | 0 | 0 | 1 | 7 | 9 | 15 | 12 | 16 | 7 | 5 | 2 | 0 |
| Phase Group | 0 | 0 | 0 | 0 | 0 | 1 | 1 | 1 | 0 | 0 | 0 | 0 |
FIG. 14
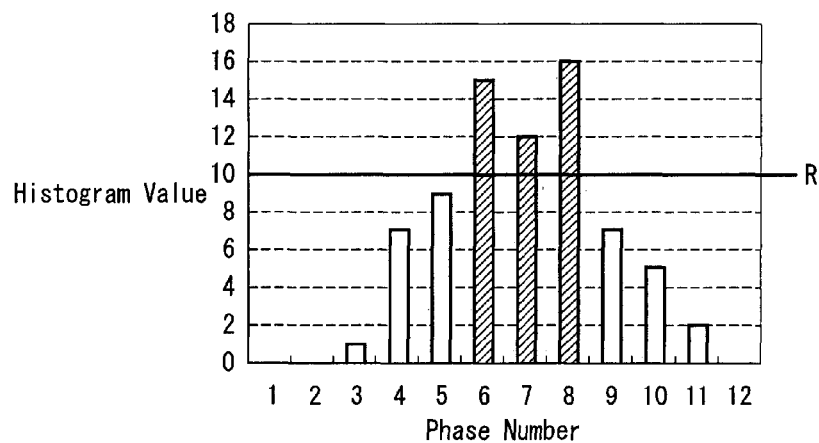
FIG. 15
| Phase | 1 | 2 | 3 | 4 | 5 | 6 | 7 | 8 | 9 | 10 | 11 | 12 |
|---|---|---|---|---|---|---|---|---|---|---|---|---|
| Histogram Value | 0 | 1 | 2 | 10 | 16 | 14 | 10 | 6 | 5 | 3 | 2 | 0 |
| Phase Group | 1 | 1 | 0 | 0 | 0 | 0 | 0 | 0 | 0 | 0 | 0 | 1 |
FIG. 16
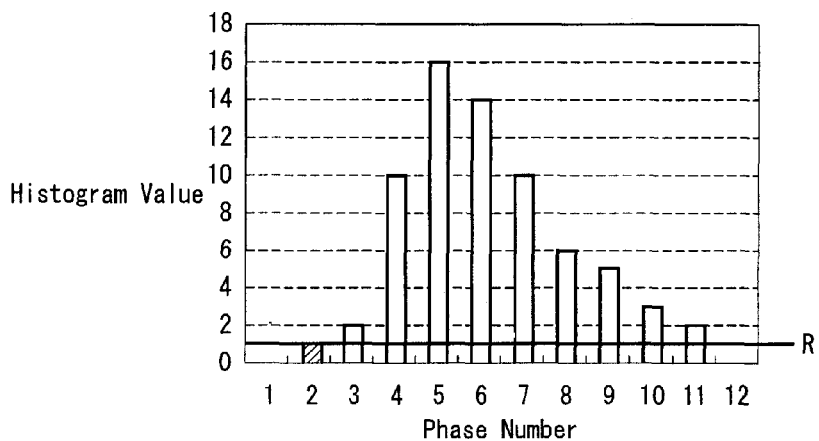

| Phase | 1 | 2 | 3 | 4 | 5 | 6 | 7 | 8 | 9 | 10 | 11 | 12 |
|---|---|---|---|---|---|---|---|---|---|---|---|---|
| Histogram Value | 0 | 0 | 1 | 7 | 9 | 15 | 12 | 16 | 7 | 5 | 2 | 0 |
| First Phase Group | 0 | 0 | 0 | 0 | 0 | 1 | 1 | 1 | 0 | 0 | 0 | 0 |
| Second Phase Group | 0 | 0 | 0 | 1 | 1 | 1 | 1 | 1 | 1 | 1 | 1 | 0 |

| Phase | 1 | 2 | 3 | 4 | 5 | 6 | 7 | 8 | 9 | 10 | 11 | 12 |
|---|---|---|---|---|---|---|---|---|---|---|---|---|
| Histogram Value | 0 | 1 | 4 | 8 | 9 | 8 | 4 | 6 | 7 | 4 | 2 | 0 |
| First Phase Group | 0 | 0 | 0 | 0 | 0 | 0 | 0 | 0 | 0 | 0 | 0 | 0 |
| Second Phase Group | 0 | 0 | 1 | 1 | 1 | 1 | 1 | 1 | 1 | 1 | 1 | 0 |

CLOCK REGENERATION CIRCUIT

BACKGROUND OF THE INVENTION

1. Field of the Invention

The present invention relates to a clock regeneration circuit for generating a clock signal that is synchronized to an input signal.

Priority is claimed on Japanese Patent Application No. 2008-044414, filed Feb. 26, 2008, and the content of which is incorporated herein by reference.

2. Description of Related Art

In radio communication, clock regeneration circuits are used to generate clock signals that are used in order to regenerate data from received signals that contain jitter. In a clock regeneration circuit, it is necessary to synchronize the received signal and the clock signal accurately. For this purpose, Japanese Unexamined Patent Application, First Publication No. H10-215289 has disclosed a method of generating a histogram indicating the number of times of detection of each position of signal transition points, from a received signal, and determining a representative phase based on the maximum value of the histogram generated, in order to optimize the phase of the clock signal.

SUMMARY OF THE INVENTION

A clock regeneration circuit according to the present invention that generates a clock signal that is synchronized to an input signal, includes: a detection section which detects points at which the input signal transitions; a histogram generation section which associates a plurality of partial periods with the transition points, and generates a first histogram indicating an incidence of the transition points for each of the partial periods, the partial periods being generated by dividing a reference period of the clock signal; a calculation processing section which generates a second histogram by calculation processing based on the first histogram, and calculates a phase adjustment value of the clock signal based on the second histogram; and a phase adjustment section which adjusts a phase of the clock signal based on the phase adjustment value.

In the clock regeneration circuit according to the present invention, it is preferable that the calculation processing section: adds the incidence of the transition points of adjacent partial periods to the incidence of the transition points for each of the partial periods constituting the first histogram to obtain addition values for each partial period; generates the second histogram indicating the addition values for each partial period; and calculates a phase adjustment value of the clock signal based on a temporal location of the partial period in which the addition value reaches its maximum.

In the clock regeneration circuit according to the present invention, it is preferable that the calculation processing section: extracts a plurality of partial periods having a high incidence of the transition points, in order, from the partial periods constituting the first histogram; generates the second histogram indicating the incidence of the transition points for each of the partial periods extracted; and calculates the phase adjustment value for the clock signal based on a temporal location of the partial period corresponding to a center of a temporal range including the partial periods constituting the second histogram.

In the clock regeneration circuit according to the present invention, it is preferable that the calculation processing section calculates the phase adjustment value for the clock signal based on the temporal location of the partial period corresponding to the center of the temporal range including the partial periods constituting the second histogram, and a temporal location of the partial period where the incidence of the transition points constituting the first histogram reaches its maximum.

In the clock regeneration circuit according to the present invention, it is preferable that the calculation processing section: extracts the partial periods where the incidence of the transition points is greater than or equal to a reference value, or less than or equal to a reference value, among the partial periods constituting the first histogram; generates a second histogram indicating the incidence of the transition points for each of the partial periods extracted; and calculates the phase adjustment value for the clock signal based on a temporal location of the partial period corresponding to a center of a temporal range including the partial periods constituting the second histogram.

In the clock regeneration circuit according to the present invention, it is preferable that the calculation processing section: extracts the partial periods where the incidence of the transition points is greater than or equal to a first reference value among the partial periods constituting the first histogram to generate the second histogram indicating the incidence of the transition points for each of the partial periods extracted; extracts the partial periods where the incidence of the transition points is greater than or equal to a second reference value which is less than the first reference value among the partial periods constituting the first histogram to generate a third histogram indicating the incidence of the transition points for each of the partial periods extracted; and calculates the phase adjustment value for the clock signal based on a temporal location of the partial period corresponding to a center of a temporal range including the partial periods constituting the second histogram, or a temporal location of the partial period corresponding to a center of a temporal range including the partial periods constituting the third histogram.

BRIEF DESCRIPTION OF THE DRAWINGS

FIG. 6 is a histogram for explaining a method of determining a representative phase number in the first embodiment of the present invention.

FIG. 7 is a histogram for explaining a method of determining a representative phase number in the first embodiment of the present invention.

FIG. 8 is a reference diagram for explaining a method of determining a representative phase number in the first embodiment of the present invention.

FIG. 13 is reference diagram for explaining a method of determining a representative phase number in the third embodiment of the present invention.

FIG. 14 is a histogram for explaining a method of determining a representative phase number in the third embodiment of the present invention.

FIG. 15 is a reference diagram for explaining a method of determining a representative phase number in the third embodiment of the present invention.

FIG. 16 is a histogram for explaining a method of determining a representative phase number in the third embodiment of the present invention.

DETAILED DESCRIPTION OF THE INVENTION

Hereunder is a description of embodiments of the present invention with reference to the drawings. In the following embodiments, a case is described, as an example, in which the present invention is applied to a receiver for an image transmission system that transmits image data in frames intermittently.

(First Embodiment)

Figure 1:
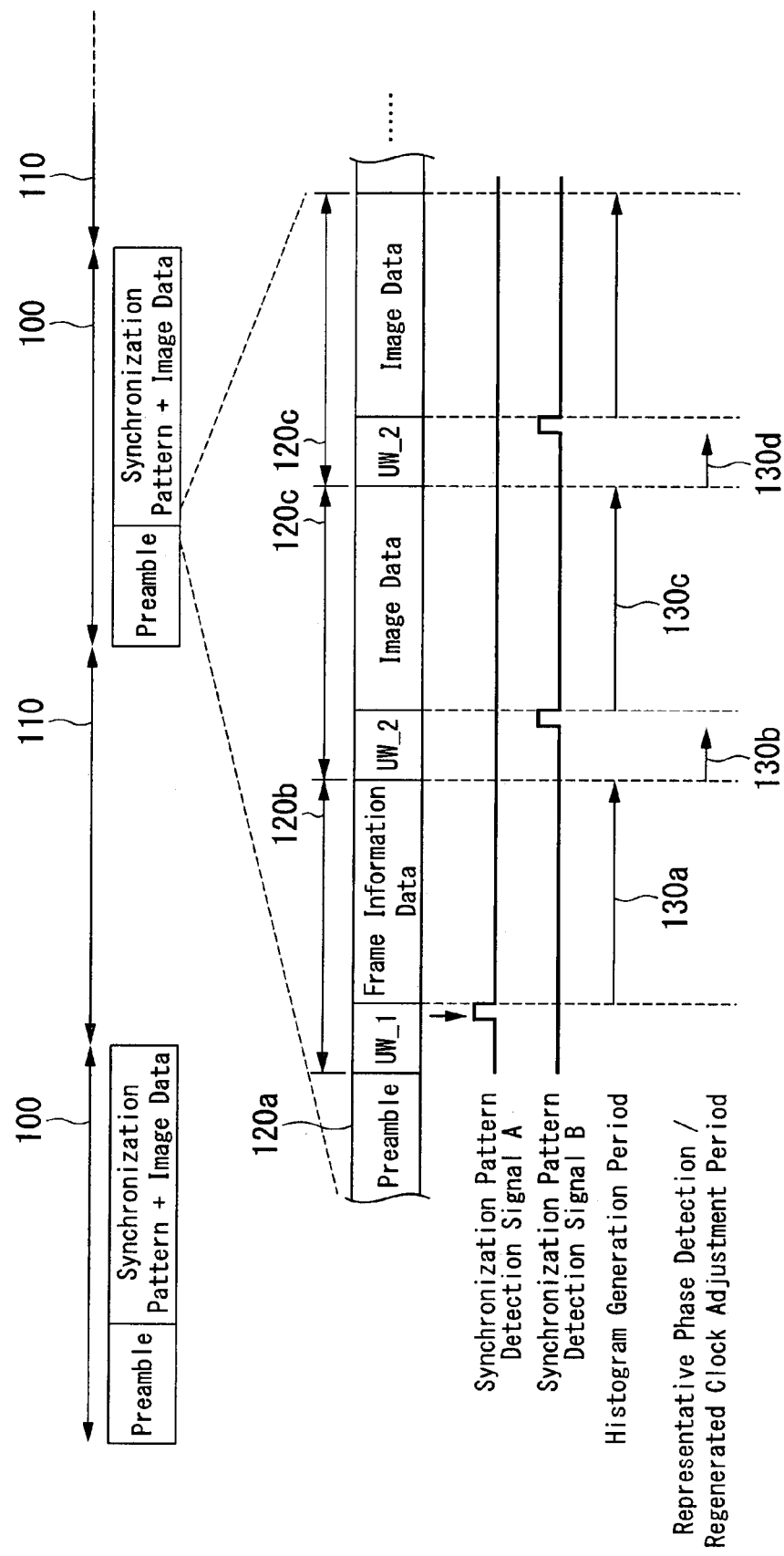
FIG. 1 is a reference diagram showing the structure of communication data in a first embodiment of the present invention.

A first embodiment of the present invention will be described. FIG. 1 shows the structure of communication data in the present embodiment. As is shown, image data is combined in frames, and transmitted as frame data in frames 100. Transmission is performed interleaved with idle periods 110.

The image data in the frame data is divided into a plurality of data blocks in predetermined units.

A preamble 120a is added to the front of the frame data. Synchronizing patterns (UW: unique word) are added to the head of each block. The preamble of the present embodiment is added in order to detect the start of transmission to stabilize the operation of a high frequency processing circuit. The synchronizing patterns are data formed in patterns that do not occur in the image data. In the present embodiment, the synchronizing patterns in the communication data are detected by correlation calculation.

Correlation calculation is performed by sampling communication data using a reference clock set at a frequency at a multiple of the symbol rate, and comparing the sampling result with a synchronization pattern. In the correlation calculation, in the case where the communication data match the synchronization pattern perfectly, the synchronization pattern detected signal becomes '1' (high). Thus, the timing of the reception of the last bit of the synchronization pattern becomes detection timing of the synchronization pattern as shown in FIG. 1.

There are two types of data block in the present embodiment, which are an information block 120b and an image block 120c as shown in FIG. 1. The information block 120b is the block immediately after the preamble 120a. The information block 120b includes a synchronization pattern (UW_1) identifying it as an information block 120b, and frame information data such as the identification number of a transmitter, a time stamp, or the like. The image blocks 120c are blocks transmitted following the information block 120b. The image block 120c includes a synchronization pattern (UW_2) identifying it as an image block 120c, and image data.

The frame information data and image data are captured and processed using a regenerated clock signal in the receiver. The phase of the regenerated clock signal is adjusted while receiving the frame information data based on the detection timing of the synchronization pattern (UW_1) detected by the above-described correlation calculation.

This phase adjustment method is well known from Japanese Unexamined Patent Application, First Publication No. H10-215289 and the like, so the description will be omitted.

The phase of the regenerated clock signal is adjusted while receiving the image data as follows. That is, the phase distribution of the received data is measured after binary coded processing in blocks to generate a histogram. The histogram obtained is processed and the representative phase is detected. The phase of the regenerated clock signal is adjusted based on the representative phase obtained. To be specific, as shown in FIG. 1, the phase distribution of the frame information data in the information block 120b is measured in the histogram generation period 130a to generate a histogram. Afterwards, the histogram is processed in the period 130b while receiving the synchronization pattern (UW_2), and the representative phase is determined. Next, the phase of the regenerated clock signal is adjusted based on the representative phase obtained.

Furthermore, the phase distribution of the image data in the first image block 120c is measured during the histogram generation period 130c to generate a histogram. Afterwards, the histogram is processed in the period 130d, during which the synchronization pattern (UW_2) of the image block 120c is being received, to determine the representative phase. Next, the phase of the regenerated clock signal is adjusted based on the representative phase obtained. As described above, the processes in which the phase distribution of the data of the previous block is measured, and the phase adjustment of the regenerated clock signal is performed based on the result during reception in the following block, is carried out during successive frame periods.

Figure 2:
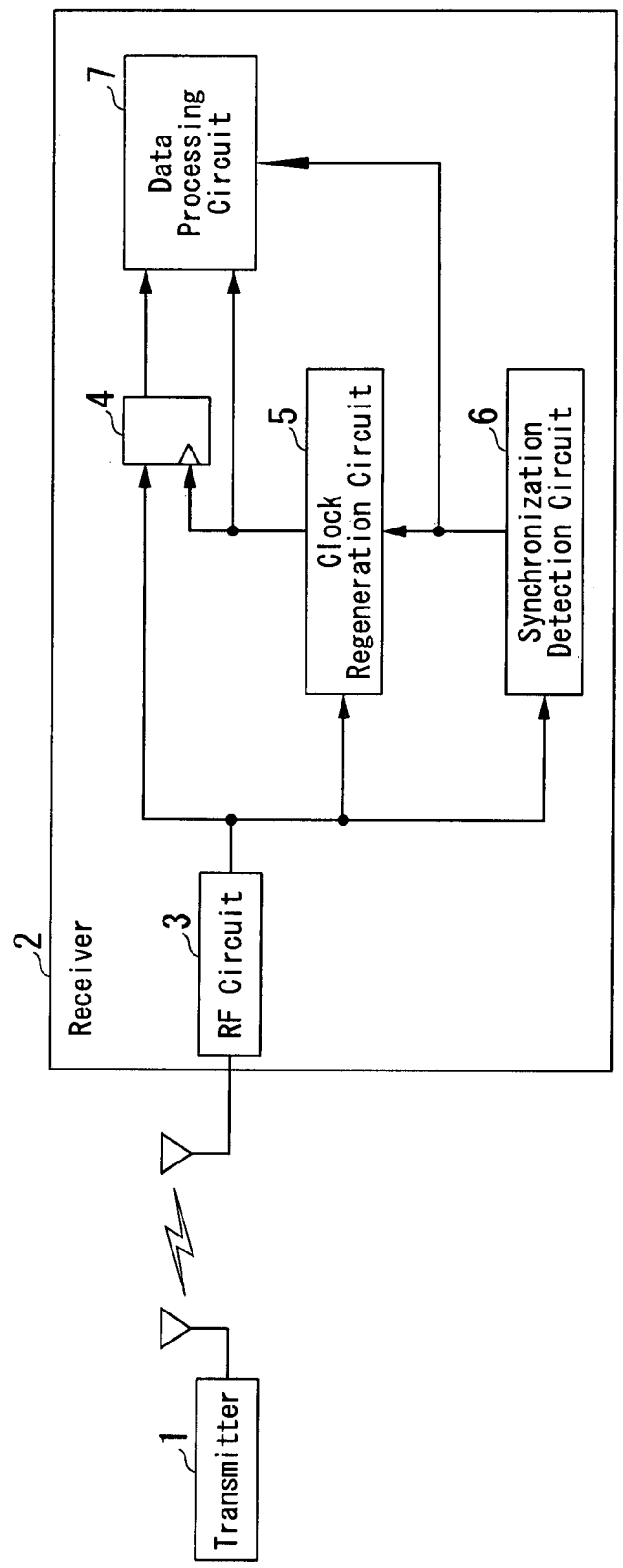
FIG. 2 is a block diagram showing the structure of a radio communication system according to the first embodiment of the present invention.

FIG. 2 shows the structure of a radio communication system according to the present embodiment. The radio communication system includes a transmitter 1, which transmits communication data by radio, and a receiver 2, which receives the transmitted communication data from the transmitter 1. The receiver 2 includes a RF (radio frequency) circuit 3, a data latch circuit 4, a clock regeneration circuit 5, a synchronization detection circuit 6, and a data processing circuit 7.

In the receiver 2, after the communication data is demodulated by the RF circuit 3 to be converted into a binary coded data signal, it is supplied to the data latch circuit 4, the clock regeneration circuit 5, and the synchronization detection circuit 6. The synchronization detection circuit 6 detects synchronization patterns (UW_1, UW_2) as shown FIG. 1. As a result, synchronization pattern detected signals A and B as shown in FIG. 1 are supplied to the clock regeneration circuit 5 and the data processing circuit 7. The clock regeneration circuit 5 adjusts the phase of the regenerated clock signal using the data signal from the RF circuit 3 and the synchronization pattern detected signal from the synchronization detection circuit 6. Furthermore, the clock regeneration circuit 5 supplies the regenerated clock signal after phase adjustment to the data latch circuit 4 and the data processing circuit 7.

The data latch circuit 4 captures the data signal from the RF circuit 3 in synchronization with the regenerated clock signal, and outputs it to the data processing circuit 7. The data processing circuit 7 reconstructs and files images using the data signal from the data latch circuit 4, the synchronization pattern detected signal from the synchronization detection circuit 6, and the regenerated clock signal from the clock regeneration circuit 5.

Figure 3:
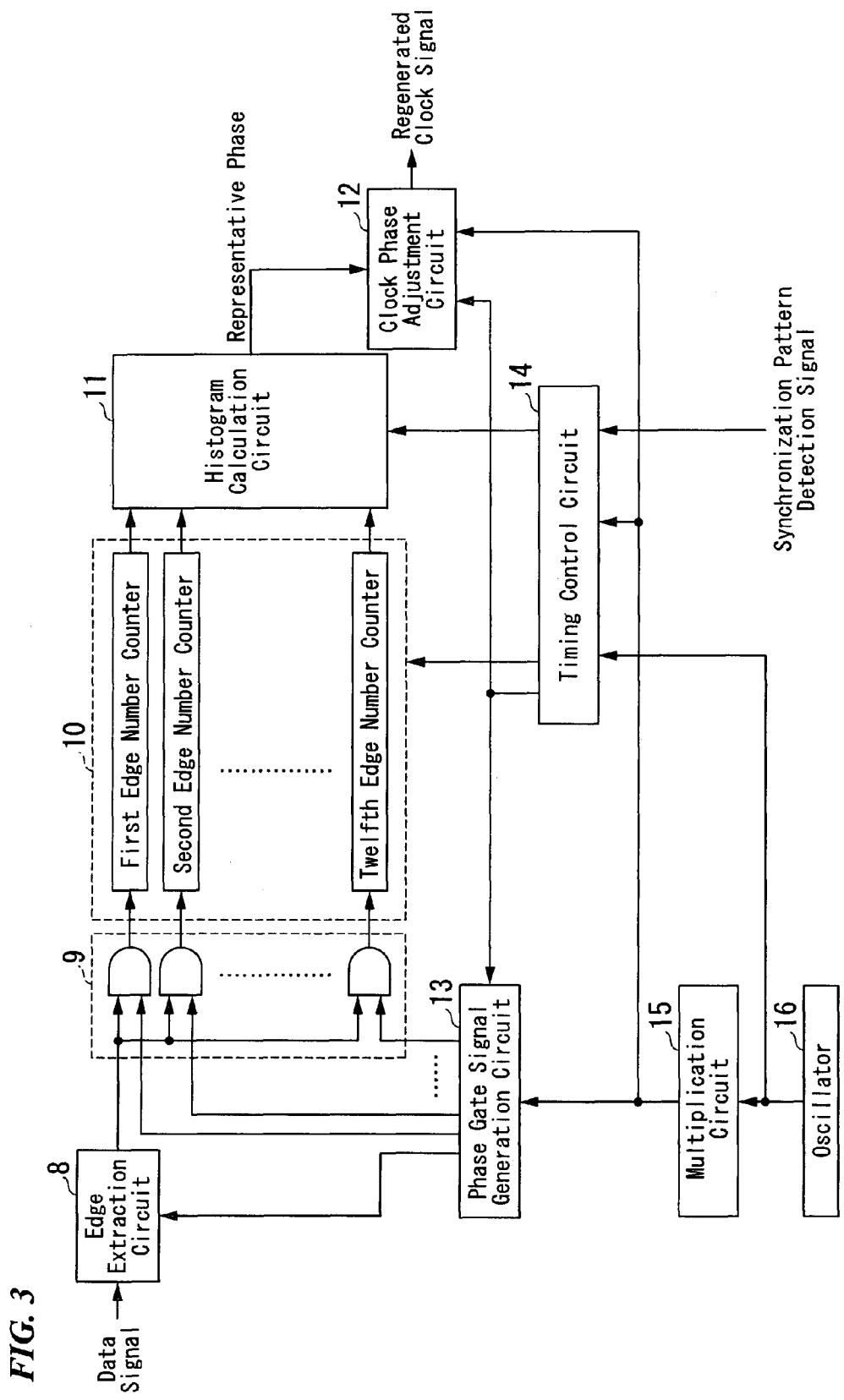
FIG. 3 is a block diagram showing the structure of a clock regeneration circuit that is provided in the radio communication system according to the first embodiment of the present invention.

FIG. 3 shows the structure of the clock regeneration circuit 5. The clock regeneration circuit 5 includes an edge extraction circuit 8, an AND gate block 9, an edge number counting block 10, a histogram calculation circuit 11, a clock phase adjustment circuit 12, a phase gate signal generation circuit 13, a timing control circuit 14, a multiplication circuit 15, and an oscillator 16.

The edge extraction circuit 8 detects both rising and falling edges, being the points at which the data signal transitions, and generates an edge signal. The edge signal generated is input to the AND gate block 9.

The oscillator 16 supplies a system clock with a frequency corresponding to the symbol rate. The multiplication circuit 15 includes a PLL (phase-locked loop) circuit, and generates a multiplied clock obtained by multiplying the system clock by twelve. The phase gate signal generation circuit 13 divides one symbol period, being a base period, into twelve partial phases (abbreviated hereunder as phases). Furthermore, the phase gate signal generation circuit 13 generates twelve gate signals (first phase gate signal to twelfth phase gate signal), which are at the high level for each respective phase.

The AND gate block 9 detects in which phase the edge signal has occurred using the edge signal and the gate signal. Moreover, the AND gate block 9 supplies count up signals (first phase count up signal to twelfth phase count up signal) to edge number counters corresponding to each phase based on the detected result.

The AND gate block 9 has a structure of twelve two-input AND gates combined. The edge signal from the edge extraction circuit 8 is applied to the inputs on one side of the AND gates, and the gate signals from the phase gate signal generation circuit 13 are applied to the inputs on the other side. The signals output from each of the AND gates are supplied to the respective first edge number counter to twelfth edge number counter in the edge number counting block 10.

The edge number counting block 10 includes a first edge number counter to twelfth edge number counter, twelve in total, corresponding to the phase numbers. The edge number counting block 10 generates a histogram indicating the edge detection incidence for each phase of the data signal by counting the number of edges for each phase. The histogram calculation circuit 11 processes one histogram and generates another histogram. Furthermore, the histogram calculation circuit 11 calculates a representative phase number from the histogram indicating a representative phase to be used for phase adjustment of the regenerated clock signal. The histogram calculation circuit 11 will be described in detail later.

The clock phase adjustment circuit 12 adjusts the phase of the regenerated clock signal by partial phases using the multiplied clock from the multiplication circuit 15, the representative phase number from the histogram calculation circuit 11, and the control signal from the timing control circuit 14. The phase of the regenerated clock signal is adjusted such that a rising edge arrives at a location shifted from the representative phase by a half cycle. The timing control circuit 14 generates a control signal to be supplied to each of the circuits in the clock regeneration circuit 5 using the system clock from the oscillator 16, the multiplied clock from the multiplication circuit 15, and the synchronization pattern detected signal from the synchronization detection circuit 6.

Figure 4:
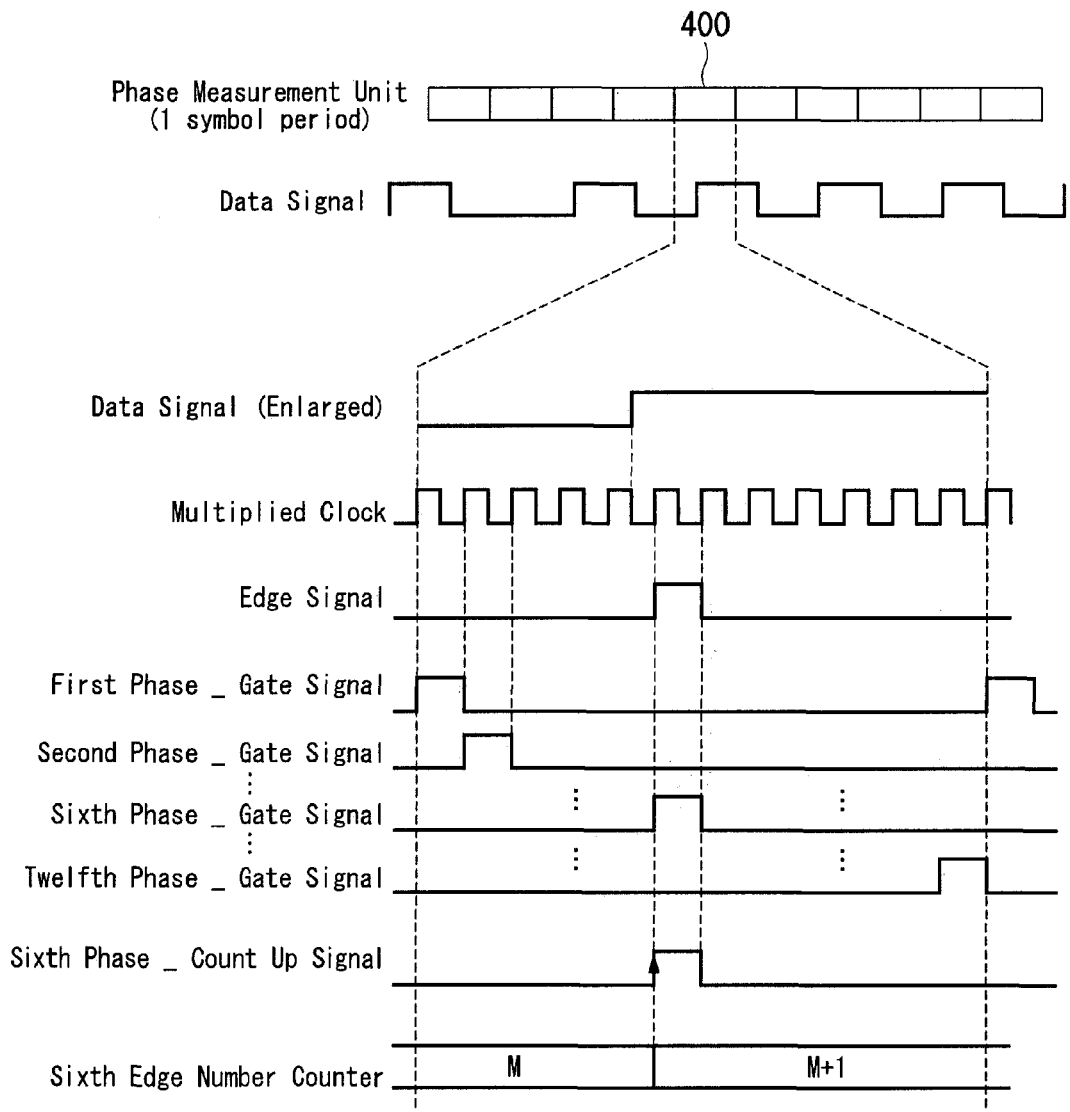
FIG. 4 is a timing chart for explaining a method of creating a histogram in the first embodiment of the present invention.

Next is a description of a method of generating a histogram in the clock regeneration circuit 5, with reference to FIG. 4. The clock regeneration circuit 5 generates a histogram by dividing one symbol period into twelve phases, detecting in which phases the edges of the data signal are located, and accumulating the detected results for each respective phase.

In FIG. 4, one zone 400, which forms a phase measurement unit, is one symbol period. One symbol period corresponds to twelve clock periods of the multiplied clock, and is set by the timing control circuit 14. In the case where the relationship in locations between the rising edge of the data signal and the multiplied clock is as shown in the figure, the edge signal is output as high from the rise of the multiplied clock immediately after the data signal transitions to high, to the next rise.

The first phase gate signal to the twelfth phase gate signal are generated by the high period being shifted such that each of the gate signals becomes high in succession. As described previously, the edge signal and each of the phase gate signals are input to the AND gate block 9. In the illustrated example, the output (sixth phase count up signal) of the AND gate to which the edge signal (high) and the sixth phase gate signal (high) are input becomes high.

The first edge number counter to the twelfth edge number counter perform count up at the rising edge of the count up signal. In the illustrated example, the sixth edge number counter performs count up, and the value of the sixth edge number counter is incremented from M to M+1. A histogram is generated in the histogram generation period as shown in FIG. 1 by repeating the above-described operation. Each of the edge number counters of the edge number counting block 10 is reset immediately before the start of the histogram generation period by the counter reset signal from the timing control circuit 14.

Next is a description of the structure and operation of the histogram calculation circuit 11. By partial additions of the values (histogram values) constituting the histogram, the histogram calculation circuit 11 generates a new histogram. Furthermore, the histogram calculation circuit 11 selects the phase corresponding to the maximum value among the histogram values constituting the histogram as a representative phase. The addition value for a central phase can be obtained by adding the values in the range containing the central phase and the phases before and behind it. For example, the addition value for the first phase can be obtained by adding the histogram values of the twelfth phase, the first phase, and the second phase. The addition value for the second phase can be obtained by adding the histogram values of the first phase, the second phase, and the third phase.

Figure 5:
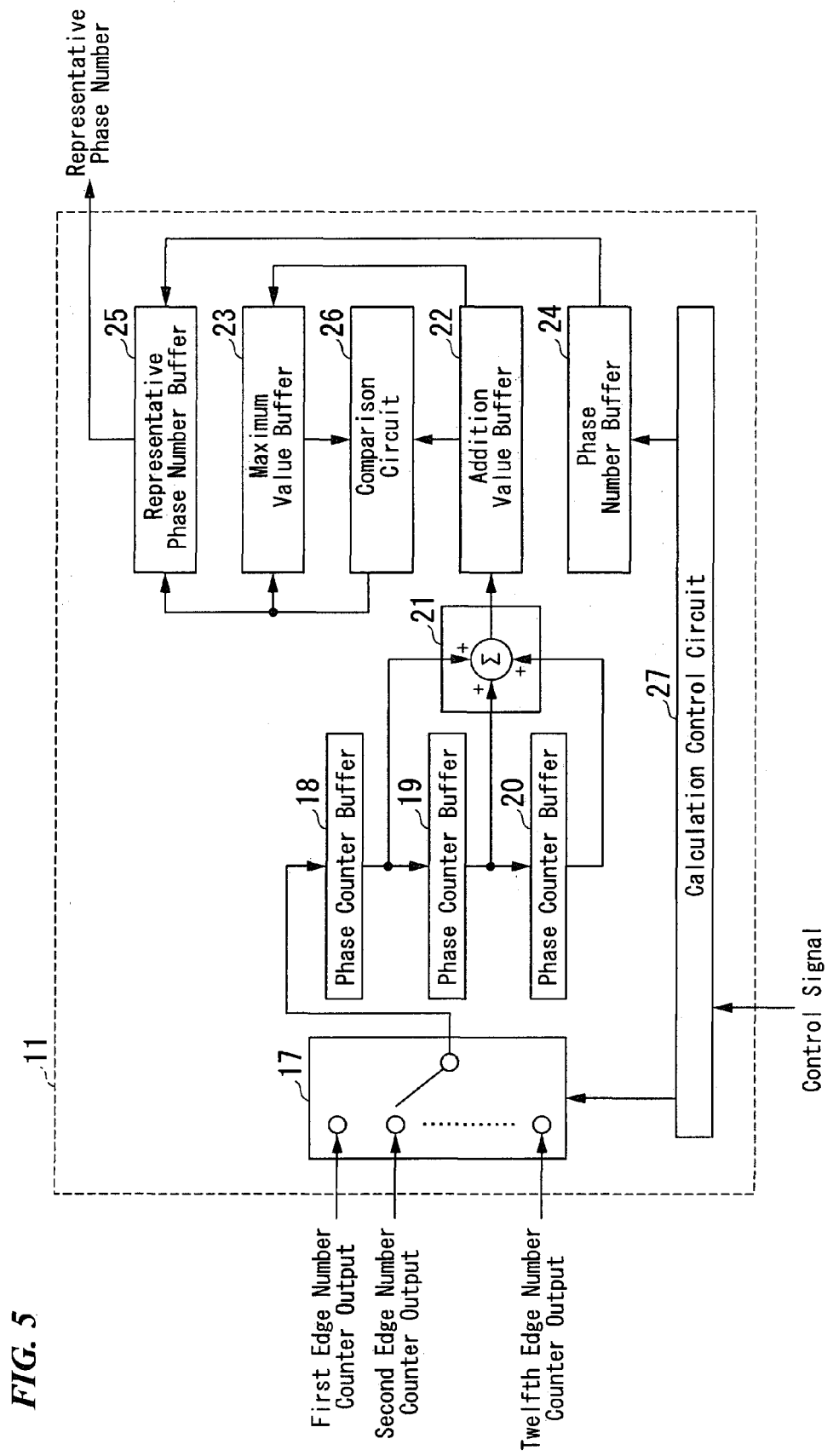
FIG. 5 is a block diagram showing the structure of a histogram calculation circuit that is provided in the radio communication system according to the first embodiment of the present invention.

FIG. 5 shows the structure of the histogram calculation circuit 11. The histogram calculation circuit 11 includes a counter selector 17, phase counter buffers 18, 19, and 20, an adding circuit 21, an addition value buffer 22, a maximum value buffer 23, a phase number buffer 24, a representative phase number buffer 25, a comparison circuit 26, and a calculation control circuit 27. The operation of each of the circuits in the histogram calculation circuit 11 is controlled by a control signal (not shown in the figure) from the calculation control circuit 27. The histogram calculation circuit 11 is controlled by a control signal from the timing control circuit 14.

The output values from each of the edge number counters in the edge number counting block 10 are applied to the counter selector 17. The counter selector 17 selects the output value from any one of the edge number counters according to the control signal from the calculation control circuit 27, and outputs it to the phase counter buffer 18. The counter selector 17 changes the selection of the counters in sequence. At the same time, the value stored in the phase counter buffer 19 is stored in the phase counter buffer 20. Moreover, the value stored in the phase counter buffer 18 is stored in the phase counter buffer 19. Furthermore, the value output from the counter selector 17 is stored in the phase counter buffer 18. In this manner, the counter values are shifted through the phase counter buffers 18, 19, and 20 in succession.

The values output from the phase counter buffers 18, 19, and 20 are input to the adding circuit 21. The adding circuit 21 adds all of the values. The addition results are stored in the addition value buffer 22. At the same time as the addition results are stored in the addition value buffer 22, the number of the central phase among the phases added is transmitted to and stored in the phase number buffer 24 from the calculation control circuit 27. The above-described processing is performed in succession corresponding to the changes in selection by the counter selector 17.

Hereunder is a description using the examples shown in FIG. 6 to FIG. 8. FIG. 8 shows histogram values and addition values for each respective phase. FIG. 6 is a graph (first histogram) of the histogram values shown in FIG. 8. FIG. 7 is a graph (second histogram) of the addition values shown in FIG. 8. The central phase in the addition processing is set from the first phase to the twelfth phase in succession. In order to operate for all of the phases, the counter selector 17 first selects the output value from the twelfth edge number counter, and then selects the first edge number counter, the second edge number counter, . . . , the twelfth edge number counter in succession. At the end, the counter selector 17 selects the first edge number counter and terminates.

The counter selector 17 selects the output value from the second edge number counter, the output value from the second edge number counter is stored in the phase counter buffer 18, the addition result of the adding circuit 21 is stored in the addition value buffer 22. At the point in time, '1' is stored in the phase number buffer 24 as the central phase number of the phases added. At this time, the histogram values (all '0') of the twelfth phase, the first phase, and the second phase are stored in respective phase counter buffers 18, 19, and 20. As a result, the output of the adding circuit 21 is '0', so the addition value buffer 22 stores '0'.

The value of the addition value buffer 22 is compared with the value of the maximum value buffer 23 by the comparison circuit 26. In the case where the value of the addition value buffer 22 is greater, the value of the addition value buffer 22 is stored in the maximum value buffer 23, and the value of the phase number buffer 24 is stored in the representative phase number buffer 25. Since the maximum value buffer 23 is empty at the point in time that the operation starts, the value of the addition value buffer 22, '0', is stored in the maximum value buffer 23, and the value of the phase number buffer 24, '1', is stored in the representative phase number buffer 25.

In the next operation, the histogram values ('0', '0', '1') of the first phase, the second phase, and the third phase are stored in the phase counter buffers 18, 19, and 20 respectively. Therefore, the output of the adding circuit 21 is '1', and '1' is stored in the addition value buffer 22. Furthermore, '2' is stored in the phase number buffer 24. The value of the addition value buffer 22, '1', is greater than the value of the maximum value buffer 23, '0'. As a result, '1' is stored in the maximum value buffer 23, and '2' is stored in the representative phase number buffer 25. The above-described operation is repeated, and after the output value from the first edge number counter is selected again by the counter selector 17, '43' is stored in the maximum value buffer 23, and '7' is stored in the representative phase number buffer 25.

In the histogram shown in FIG. 6, the eighth phase, where the histogram value reaches its maximum, is shifted from the center of the distribution of the histogram. On the other hand, in the graph of the addition values shown in FIG. 7, the seventh phase, where the addition value reaches its maximum, is located almost in the center of the distribution of the addition values. In order to perform phase adjustment of the clock signal accurately, it is desirable that the phase in the center of the distribution in consideration of the shape of the histogram is made the representative phase. Accordingly, it is desirable to make the seventh phase the representative phase rather than the eighth phase, and it is possible to detect an accurate representative phase by the above-described operation.

As described above, according to the present embodiment, a new histogram is generated by performing calculations based on the histogram obtained by detecting the edge locations of a received signal. Furthermore, the representative phase number of a clock signal is calculated based on this histogram. In this manner, even in the case where dispersion occurs in the histogram due to signal deterioration during transmission, it is possible to detect the real central phase in consideration of the shape of the histogram, which enables the accuracy of the phase adjustment of the clock signal to be improved. In particular, according to the present embodiment, by adding the histogram values constituting the histogram within the predetermined phase ranges, the histogram values are averaged. Therefore, in the case where the number of detections is low, or there is local disorder in the histogram, which occurs in the case where signal deterioration due to jitter, such as random jitter, or the like is severe, it is possible to suppress its influence and obtain an optimum representative phase number.

(Second Embodiment)

Figure 9:
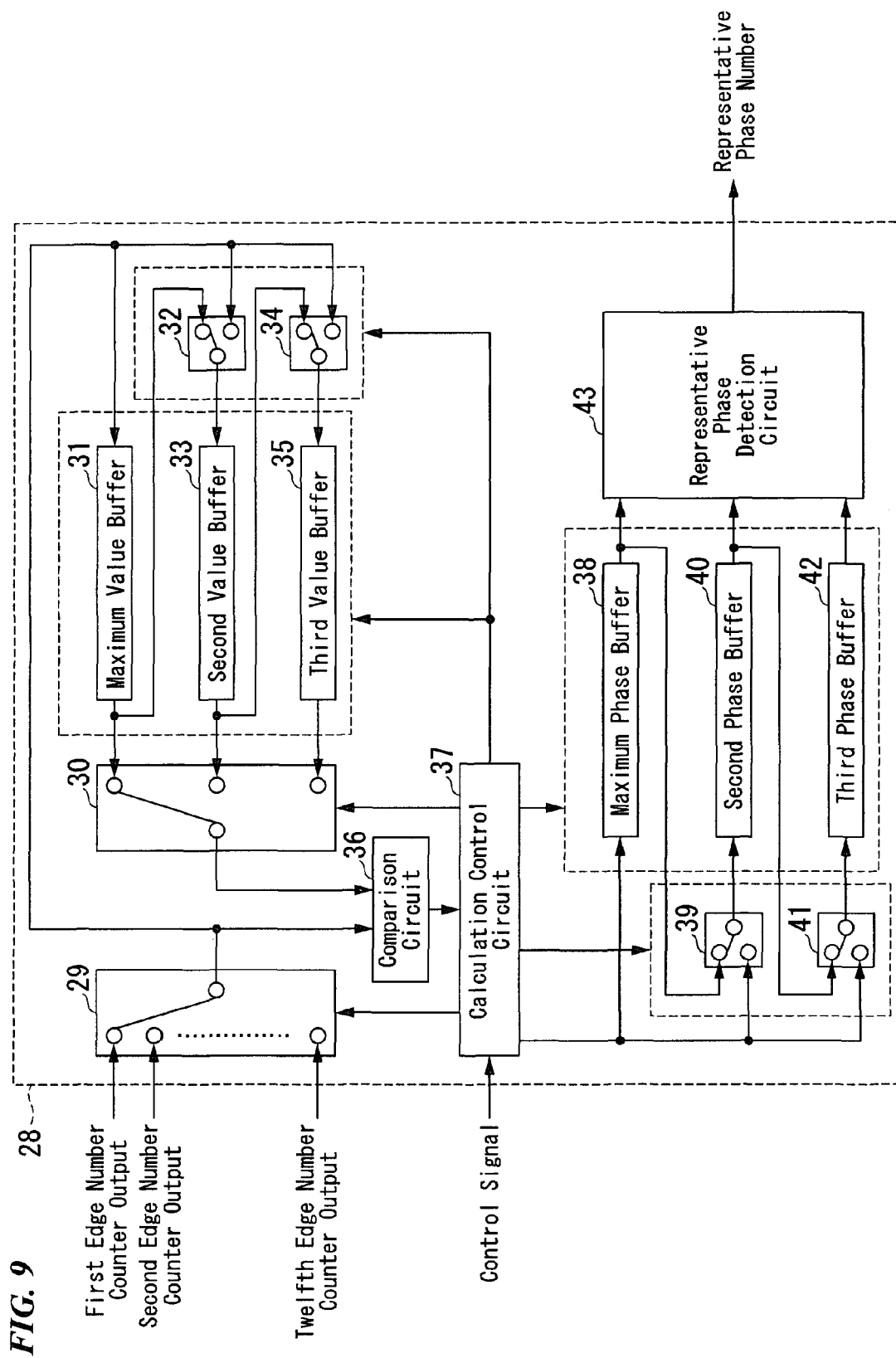
FIG. 9 is a block diagram showing the structure of a histogram calculation circuit that is provided in a radio communication system according to a second embodiment of the present invention.

Next is a description of a second embodiment of the present invention. FIG. 9 shows the structure of a histogram calculation circuit 28 of the present embodiment corresponding to the histogram calculation circuit 11 shown in FIG. 3. The histogram calculation circuit 28 includes a counter selector 29, a buffer selector 30, a maximum value buffer 31, a second value selector 32, a second value buffer 33, a third value selector 34, a third value buffer 35, a comparison circuit 36, a calculation control circuit 37, a maximum phase buffer 38, a second phase selector 39, a second phase buffer 40, a third phase selector 41, a third phase buffer 42, and a representative phase detection circuit 43.

The histogram calculation circuit 28 of the present embodiment compares the histogram values from the first phase to the twelfth phase in succession, and detects the three phases with the highest histogram values, in order. Furthermore, the histogram calculation circuit 28 selects the representative phase based on the locations of the phases of the histogram constituted by the three phases of histogram values. In the case where the three phases detected are consecutive, the phase in the central location is selected as the representative phase. In the case where the three phases detected are not consecutive, the phase that is closest to the center of the phase range including the three phases, and closest to the phase where the histogram value is the maximum, is selected as the representative phase.

Hereunder is a description using the example shown in FIG. 8. The operation of each of the circuits in the histogram calculation circuit 28 is controlled by the control signal from the calculation control circuit 37. The histogram calculation circuit 28 is controlled by the control signal from the timing control circuit 14. On receiving the operation start control signal from the timing control circuit 14, the calculation control circuit 37 controls the counter selector 29, and instructs the counter selector 29 to output an output value '0' from the first edge number counter. The value output from the counter selector 29 is stored in the maximum value buffer 31. At the same time, the calculation control circuit 37 outputs a phase number '1', and stores it in the maximum phase buffer 38.

Next, the calculation control circuit 37 controls the counter selector 29, and instructs the counter selector 29 to output an output value '0' from the second edge number counter. The output value from the counter selector 29 is input to the comparison circuit 36. Moreover, the calculation control circuit 37 controls the buffer selector 30, and instructs it to output the value of the maximum value buffer 31 to the comparison circuit 36. The comparison circuit 36 compares the output value from the counter selector 29 and the output value from the maximum value buffer 31. The comparison circuit 36 determines that the two values are identical as a result of the comparison, and informs the determination result to the calculation control circuit 37.

In the present embodiment, in the case where the comparison result indicates identical values, the value output previously from the counter selector 29 has priority. To be specific, on receiving the information from the comparison circuit 36, the calculation control circuit 37 does not change the value of the maximum value buffer 31, but controls the second value selector 32 such that it stores the output value from the counter selector 29 in the second value buffer 33. Furthermore, the calculation control circuit 37 outputs the phase number '2', and stores it in the second phase buffer 40 via the second phase selector 39.

Next, the calculation control circuit 37 controls the counter selector 29 and instructs the counter selector 29 to output the output value from the third edge number counter, '1'. The output value from the counter selector 29 is input to the comparison circuit 36. Moreover, firstly, the value of the maximum value buffer 31, '0', is input to the comparison circuit 36 via the buffer selector 30, and then the value of the second value buffer 33, '0', is input. The comparison circuit 36 performs comparison calculations twice in total according to the inputs.

The comparison circuit 36 compares the output value from the counter selector 29, '1', and the output value from the maximum value buffer 31, '0', and then compares the output value from the counter selector 29, '1', and the output value from the second value buffer 33, '0'. As a result of the comparison, the comparison circuit 36 determines that the output value from the counter selector 29 is greater than the value of the maximum value buffer 31 and the value of the second value buffer 33, and informs the determination result to the calculation control circuit 37.

On receiving the information from the comparison circuit 36, the calculation control circuit 37 stores the value of the second value buffer 33, '0', in the third value buffer 35 via the third value selector 34, and stores the value of the maximum value buffer 31, '0', in the second value buffer 33 via the second value selector 32. Furthermore, the calculation control circuit 37 stores the output value from the counter selector 29, '1', in the maximum value buffer 31. Moreover, the calculation control circuit 37 stores the value of the second phase buffer 40, '2', in the third phase buffer 42 via the third phase selector 41, and stores the value of the maximum phase buffer 38, '1', in the second phase buffer 40 via the second phase selector 39. Furthermore, the calculation control circuit 37 stores the phase number, '3', in the maximum phase buffer 38.

Next, the calculation control circuit 37 controls the counter selector 29 and instructs the counter selector 29 to output the output value from the fourth edge number counter, '7'. The output value from the counter selector 29 is input to the comparison circuit 36. Furthermore, to the comparison circuit 36, firstly, the value of the maximum value buffer 31, '1', is input, then the value of the second value buffer 33, '0', is input, and then the value of the third value buffer 35, '0', is input via the buffer selector 30. The comparison circuit 36 performs comparison calculation three times in total according to the inputs.

The comparison circuit 36 compares the output value from the counter selector 29, '7', and the output value from the maximum value buffer 31, '1'. Then, the comparison circuit 36 compares the output value from the counter selector 29, '7', and the output value from the second value buffer 33, '0'. Then, the comparison circuit 36 compares the output value from the counter selector 29, '7', and the output value from the third value buffer 35, '0'. As a result of the comparison, the comparison circuit 36 determines that the output value from the counter selector 29 is greater than the value of the maximum value buffer 31, the value of the second value buffer 33, and the value of the third value buffer 35, and informs the determination result to the calculation control circuit 37.

Afterwards, similar processing to that described above is repeated up until the twelfth phase, and the values of the maximum value buffer 31, the second value buffer 33, the third value buffer 35, the maximum phase buffer 38, the second phase buffer 40, and the third phase buffer 42 are updated appropriately.

Here is a description of the operation in the case where the output value from the counter selector 29 is greater than at least any one of the values of the maximum value buffer 31, the second value buffer 33, and the third value buffer 35. In this case, the value of the buffer that holds a value less than the output value from the counter selector 29 is shifted, and the output value from the counter selector 29 is stored in the empty buffer. Furthermore, corresponding to this, the value of at least any one of the maximum phase buffer 38, the second phase buffer 40, and the third phase buffer 42, is shifted, and the phase number from the calculation control circuit 37 is stored in the empty buffer.

For example, at the point in time that the output value of the seventh edge number counter, '12', is selected by the counter selector 29, the maximum value buffer 31, the second buffer 33, and the third value buffer 35 store '15', '9', and '7', respectively. Further, the maximum phase buffer 38, the second phase buffer 40, and the third phase buffer 42, store '6', '5', and '4' respectively. The output value from the counter selector 29, '12', is less than the value of the maximum value buffer 31, '15', and greater than the value of the second value buffer 33, '9', and the value of the third value buffer 35, '7'. Therefore, the calculation control circuit 37 stores the value of the second value buffer 33 in the third value buffer 35, and stores the output value from the counter selector 29 in the second value buffer 33. Moreover, the calculation control circuit 37 stores the value of the second phase buffer 40 in the third phase buffer 42, and stores the phase number '7' in the second phase buffer 40.

By the above-described procedure, the maximum phase buffer 38, the second phase buffer 40, and the third phase buffer 42 store the phase numbers with the highest histogram values, in order. The representative phase detection circuit 43 generates a representative phase number from the phase number of the maximum phase buffer 38, the phase number of the second phase buffer 40, and the phase number of the third phase buffer 42. As described previously, in the case where the three phase numbers are consecutive, the phase in the center is selected as the representative phase. In the case where the three phases are not consecutive, the phase that is closest to the center of the phase range including the three phases, and closest to the phase where the histogram value is the maximum, is selected as the representative phase.

Figure 10:
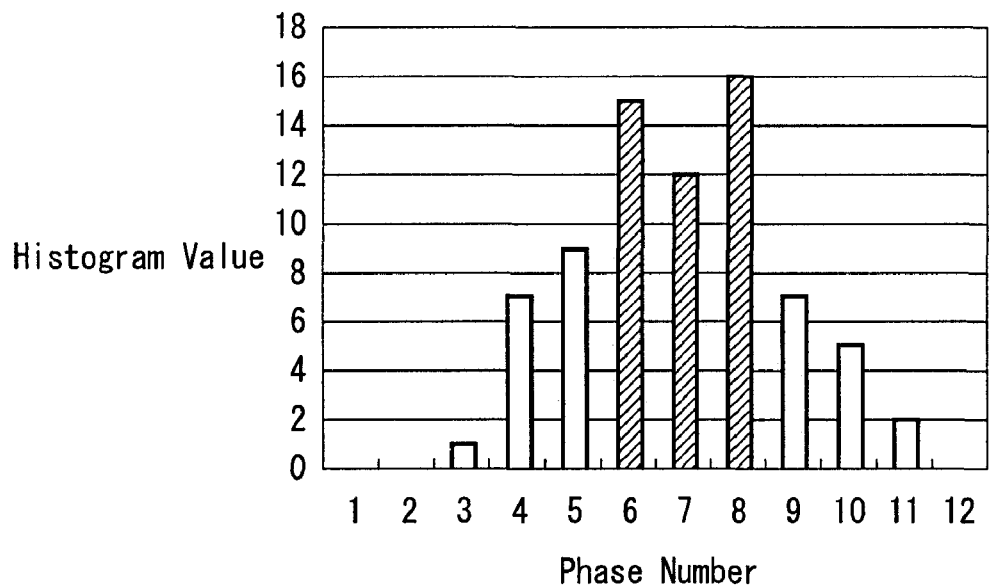
FIG. 10 is a histogram for explaining a method of determining a representative phase number in the second embodiment of the present invention.
Figure 11:
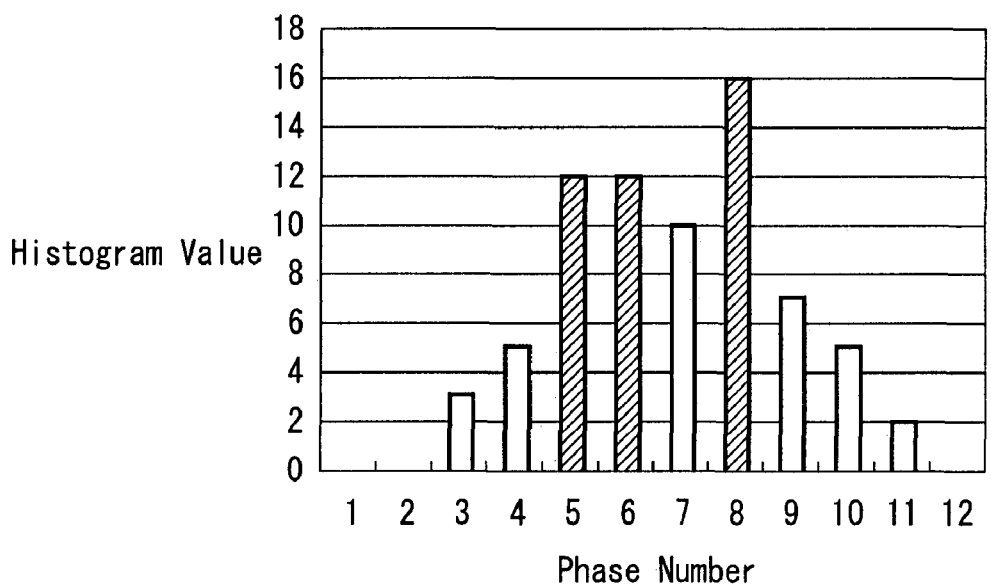
FIG. 11 is a histogram for explaining a method of determining a representative phase number in the second embodiment of the present invention.

Hereunder is a detailed description of a method of deciding a representative phase number. FIG. 10 and FIG. 11 show different histogram examples. In FIG. 10, the phase numbers corresponding to the three highest histogram values are, in order from the highest histogram value, 8, 6, and 7. Since the three phase numbers are consecutive, the seventh phase in the central position of the phase range (sixth phase to eighth phase) of the three phases is the representative phase. In FIG. 11, the phase numbers corresponding to the three highest histograms are, in order from the highest histogram value, 8, 6, and 5. The three phase numbers are not consecutive, and the central location of the phase range (fifth phase to eighth phase) of the three phases is the sixth phase or the seventh phase. Since the phase number of the maximum phase buffer 38 is 8, the seventh phase, which is closest to the eighth phase, is the representative phase.

As described above, according to the present embodiment, similarly to the first embodiment, even in the case where dispersion occurs in the histogram due to signal deterioration during transmission, it is possible to detect the real central phase in consideration of the shape of the histogram. As a result, it is possible to improve the accuracy of the phase adjustment of the clock signal. In particular, according to the present embodiment, the phase number corresponding to the center of the phase range formed by a plurality of phases with large detected edge counts is made the representative phase number. Therefore, even in the case where the received signal contains jitter due to inter-symbol interference or the like, whereby the peak of the histogram is dispersed in a fixed range, it is possible to obtain an optimum representative phase number. Furthermore, in the case where there is a plurality of candidates for the representative phase number, it is possible to select the phase that is closest to the real center of the histogram by making the number of the phase that is closest to the phase with the largest histogram value the representative phase number.

(Third Embodiment)

Figure 12:
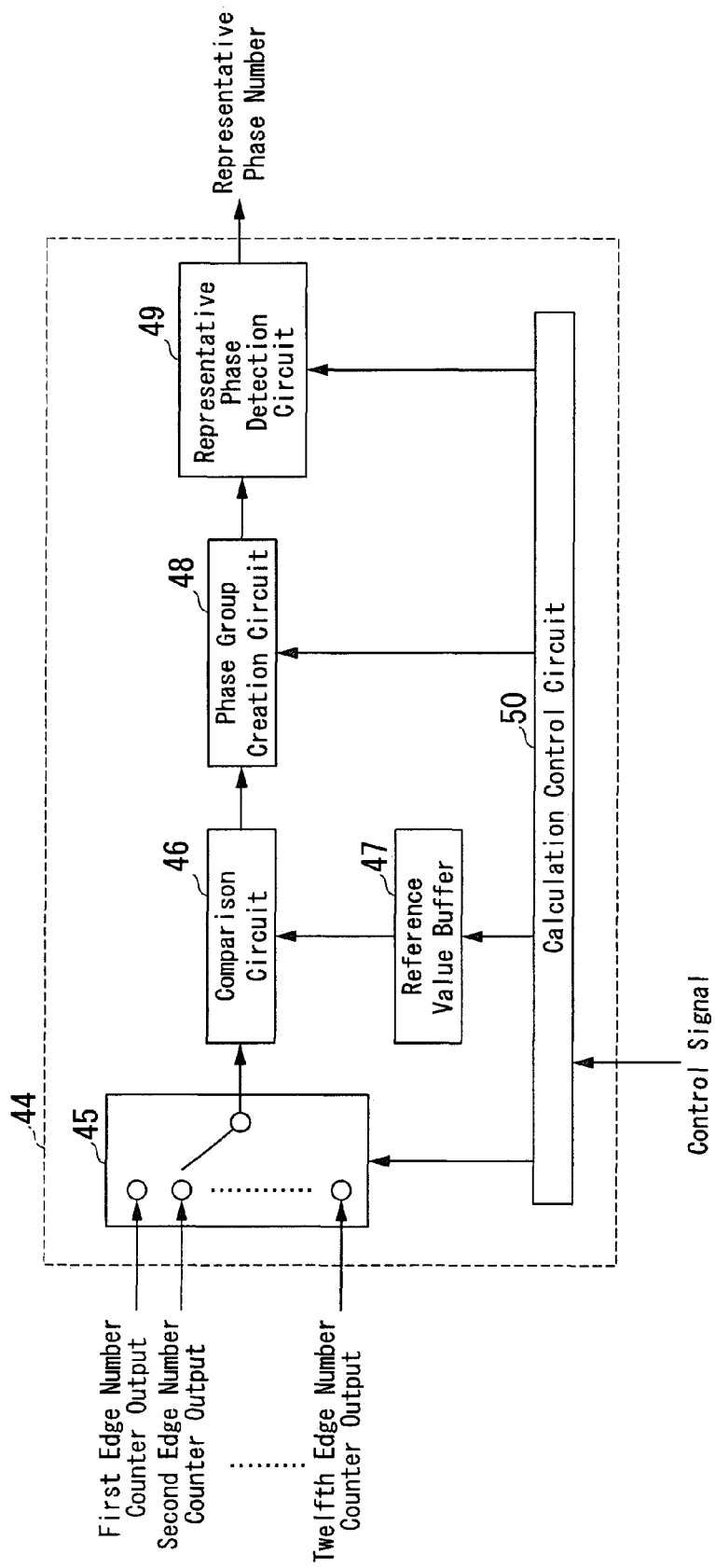
FIG. 12 is a block diagram showing the structure of a histogram calculation circuit that is provided in a radio communication system according to a third embodiment of the present invention.

Next is a description of a third embodiment of the present invention. FIG. 12 shows the structure of a histogram calculation circuit 44 of the present embodiment, corresponding to the histogram calculation circuit 11 shown in FIG. 3. The histogram calculation circuit 44 includes a counter selector 45, a comparison circuit 46, a reference value buffer 47, a phase group generation circuit 48, a representative phase detection circuit 49, and a calculation control circuit 50.

The histogram calculation circuit 44 of the present embodiment compares the histogram values of the first phase to the twelfth phase, in succession, with a reference value R, and detects whether the histogram value of each phase is greater than or equal to the reference value R, or less than or equal to the reference value R. Moreover, the histogram calculation circuit 44 generates a phase group (histogram) formed by the histogram values of the detected phases. The histogram calculation circuit 44 selects the representative phase from among the generated phase group. In the case where the phases whose histogram values are greater than or equal to the reference value R are detected to generate a phase group, the phase in the center of the phase group is selected as the representative phase. In the case where the phases whose histogram values are less than or equal to the reference value R are detected to generate a phase group, the phase that is shifted by one half cycle from the central phase in the phase group is selected as the representative phase.

Hereunder is a description of an example in which phases whose histogram values are greater than or equal to the reference value R are detected to generate a phase group, and the representative phase is selected, with reference to FIG. 13 and FIG. 14. FIG. 13 shows the relationship between the histogram values and the phase group. FIG. 14 shows the phases selected as the phase group in the histogram.

The operation of each of the circuits in the histogram calculation circuit 44 is controlled by a control signal from the calculation control circuit 50. The histogram calculation circuit 44 is controlled by a control signal from the timing control circuit 14. On receiving the operation start control signal from the timing control circuit 14, the calculation control circuit 50 controls the counter selector 45, and instructs the counter selector 45 to output an output value '0' from the first edge number counter. The value output from the counter selector 45 is input to the comparison circuit 46. The reference value R is also input to the comparison circuit 46 from the reference value buffer 47. Hereunder is a description with the reference value R being '10'.

The comparison circuit 46 compares the output value from the counter selector 45 with the reference value R, '10'. In the case where the output value is greater than or equal to the reference value R, the comparison circuit 46 outputs a value '1' to the phase group generation circuit 48, and in the case where it is less than the reference value R, it outputs a value '0' to the phase group generation circuit 48. Since the output value from the counter selector 45 is '0', the output value of the comparison circuit 46 is '0'.

When the above-described procedure is repeated from the first phase to the twelfth phase, information having the content shown as the phase group in FIG. 13 is generated in the phase group generation circuit 48. In the example shown in FIG. 13, the phases constituting the phase group are the sixth phase, the seventh phase and the eighth phase. The information of the phase group is output from the phase group generation circuit 48 to the representative phase detection circuit 49. In the case where phases whose histogram values are greater than or equal to the reference value R are detected to generate the phase group, the representative phase detection circuit 49 selects the phase in the center of the phase group as the representative phase. In the example shown in FIG. 13, the phase number '7' is selected as the representative phase number, and is output.

Next is a description of an example in which phases whose histogram values are less than or equal to the reference value R are detected to generate the phase group, and the representative phase is selected, with reference to FIG. 15 and FIG. 16. FIG. 15 shows the relationship between the histogram values and the phase group. FIG. 16 shows the phases selected as the phase group in the histogram.

The operation of each of the circuits in the histogram calculation circuit 44 is controlled by a control signal from the calculation control circuit 50. On receiving the operation start control signal from the timing control circuit 14, the calculation control circuit 50 controls the counter selector 45, and instructs the counter selector 45 to output an output value '0' from the first edge number counter. The value output from the counter selector 45 is input to the comparison circuit 46. The reference value R is also input to the comparison circuit 46 from the reference value buffer 47. Hereunder is a description with the reference value R being '1'.

The comparison circuit 46 compares the output value from the counter selector 45 with the reference value R, '1'. In the case where the output value is less than the reference value R, the comparison circuit 46 outputs a value '1' to the phase group generation circuit 48, and in the case where it is greater than the reference value R, it outputs a value '0' to the phase group generation circuit 48. Since the output value from the counter selector 45 is '0', the output value of the comparison circuit 46 is '1'.

When the above-described procedure is repeated from the first phase to the twelfth phase, information having the content shown as the phase group in FIG. 15 is generated in the phase group generation circuit 48. In the example shown in FIG. 15, the phases constituting the phase group are the first phase, the second phase, and the twelfth phase. The information of the phase group is output from the phase group generation circuit 48 to the representative phase detection circuit 49. In the case where phases whose histogram values are less than or equal to the reference value R are detected to generate the phase group, the representative phase detection circuit 49 selects the phase that is shifted by a half cycle from the central phase of the phase group as the representative phase. In the example shown in FIG. 15, the phase number '7' of the seventh phase, which is shifted by a half cycle from the first phase in the center of the phase group, is selected as the representative phase number, and is output.

As described above, according to the present embodiment, similarly to the first embodiment, even in the case where dispersion occurs in the histogram due to signal deterioration during transmission, it is possible to detect the real central phase in consideration of the shape of the histogram. As a result, it is possible to improve the accuracy of the phase adjustment of the clock signal. In particular, according to the present embodiment, phases whose histogram values are greater than or equal to the reference value R, or less than or equal to the reference value R, are extracted to generate a phase group, and the representative value is selected based on the number of the phase corresponding to the center of the phases constituting the phase group. Therefore, even in the case where the received signal contains jitter due to inter-symbol interference or the like, whereby the peak of the histogram is dispersed in a fixed range, it is possible to obtain an optimum representative phase number.

Furthermore, by generating a phase group using the comparison result with the reference value R, it is possible to simplify the structure of the histogram calculation circuit 44. Moreover, in the case where phases whose histogram values are less than or equal to the reference value R are extracted to generate a phase group, and the representative phase number is selected based on the number of the phase corresponding to the center of the phases constituting the phase group, the representative phase number is selected regardless of the shape of the distribution of the histogram values that are greater than or equal to a predetermined value. Therefore, even in the case where a histogram in which the distribution of the histogram values is left-right asymmetrical due to the influence of duty cycle distortion or the like is used, it is possible to obtain an optimum representative phase number.

(Fourth Embodiment)

Figure 17:
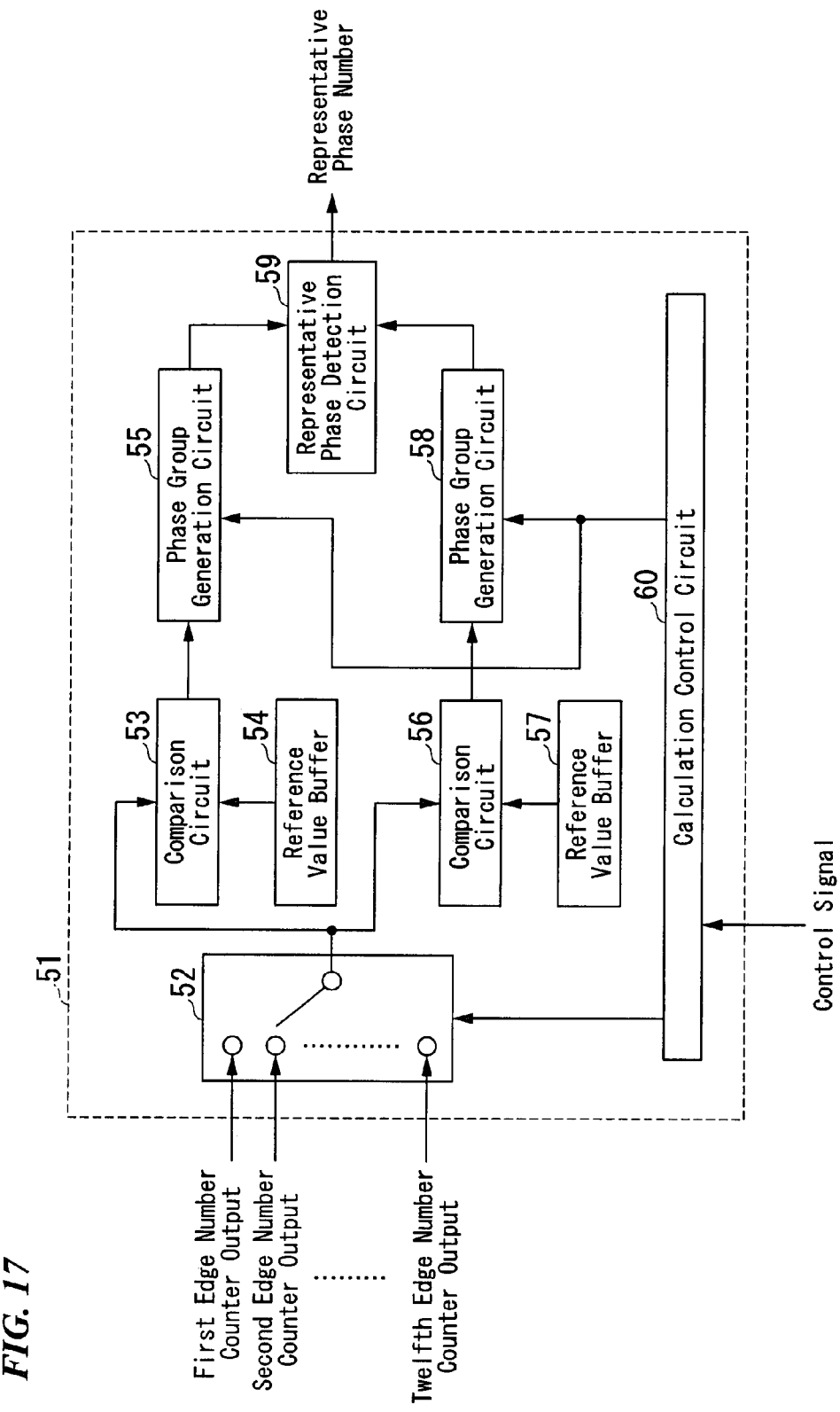
FIG. 17 is a block diagram showing the structure of a histogram calculation circuit that is provided in a radio communication system according to a fourth embodiment of the present invention.

Next is a description of a fourth embodiment of the present invention. FIG. 17 shows the structure of a histogram calculation circuit 51 of the present embodiment corresponding to the histogram calculation circuit 11 shown in FIG. 3. The histogram calculation circuit 51 includes a counter selector 52, comparison circuits 53 and 56, reference value buffers 54 and 57, phase group generation circuits 55 and 58, a representative phase detection circuit 59, and a calculation control circuit 60.

The histogram calculation circuit 51 of the present embodiment compares the histogram values from the first phase to the twelfth phase, in succession, with two reference values. Moreover, the histogram calculation circuit 51 detects whether the histogram value of each phase is greater than or equal to each of the reference values, and generates two phase groups (histograms) formed by the histogram values of the detected phases. The histogram calculation circuit 44 selects one phase group from the two phase groups generated according to a predetermined condition, and selects the representative phase from the phase group.

To be specific, in the case where there are phases contained in the first phase group generated with respect to a first reference value R1 (in the case where there is at least one phase whose histogram value is greater than the first reference value R1), the phase in the center of the first phase group is selected as the representative phase. In the case where there is no phase contained in the first phase group (in the case where there is no phase whose histogram value is greater than the first reference value R1), the phase in the center of the second phase group generated with respect to a second reference value R2 is selected as the representative phase. Here, the second reference value R2 is less than the first reference value R1 (the second reference value R2<the first reference value R1).

Figures 18, 19, 20:
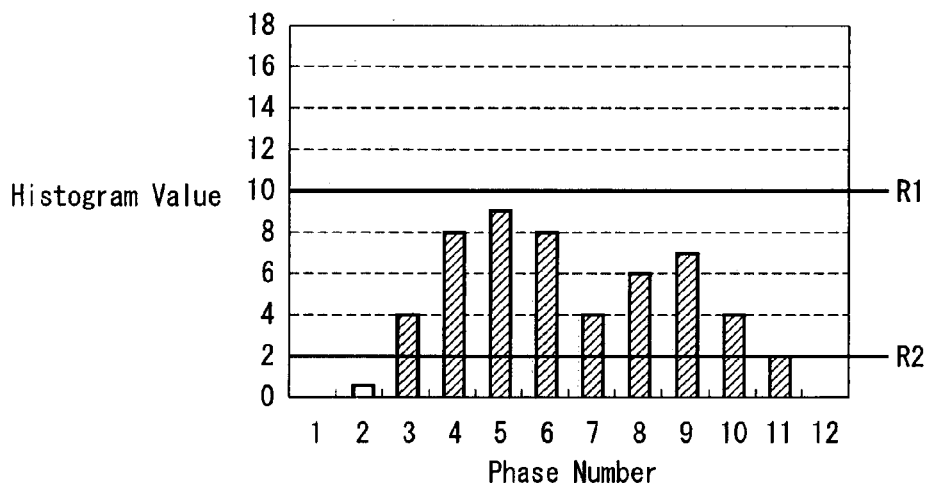
FIG. 18 is a reference diagram for explaining a method of determining a representative phase number in the fourth embodiment of the present invention.
FIG. 19 is a reference diagram for explaining a method of determining a representative phase number in the fourth embodiment of the present invention.
FIG. 20 is a histogram for explaining a method of determining a representative phase number in the fourth embodiment of the present invention.

Hereunder is a description of an example in which the representative phase is selected, with reference to FIG. 18 to FIG. 20. FIG. 18 shows the relationship between the histogram values and the phase groups in the case where there are phases registered in the first phase group corresponding to the first reference value R1. FIG. 19 shows the relationship between the histogram values and the phase groups in the case where there is no phase registered in the first phase group. FIG. 20 shows the relationship between two reference values, the histogram, and phase groups in the example shown in FIG. 19.

The operation of each of the circuits in the histogram calculation circuit 51 is controlled by a control signal from the calculation control circuit 60. The histogram calculation circuit 51 is controlled by a control signal from the timing control circuit 14. On receiving the operation start control signal from the timing control circuit 14, the calculation control circuit 60 controls the counter selector 52, and instructs the counter selector 52 to output an output value '0' from the first edge number counter. The value output from the counter selector 52 is input to the comparison circuits 53 and 56. The first reference value R1 is also input to the comparison circuit 53 from the reference value buffer 54. The second reference value R2 is also input to the comparison circuit 56 from the reference value buffer 57. Hereunder is a description with the first reference value R1 being '10', and the second reference value R2 being '2'.

The comparison circuit 53 compares the output value from the counter selector 52 with the first reference value, '10'. In the case where the output value is greater than or equal to the first reference value R1, the comparison circuit 53 outputs a value '1' to the phase group generation circuit 55, and in the case where it is less than the first reference value R1, it outputs a value '0' to the phase group generation circuit 55. The comparison circuit 56 compares the output value from the counter selector 52 with the second reference value, '2'. In the case where the output value is greater than or equal to the second reference value R2, the comparison circuit 56 outputs a value '1' to the phase group generation circuit 58, and in the case where it is less than the second reference value R2, it outputs a value '0' to the phase group generation circuit 58. The phase group generation circuits 55 and 58 generate information of the first phase group and the second phase group respectively, and output them to the representative phase detection circuit 59. The representative phase detection circuit 59 selects the representative phase using the first phase group and the second phase group.

As described above, the first reference value R1 is '10', and the second reference value R2 is '2'. Therefore, in the example shown in FIG. 18, the phase numbers constituting the first phase group are "6, 7, and 8", and the phase numbers constituting the second phase group are "4, 5, 6, 7, 8, 9, 10, and 11". Since the first phase group contains three phase numbers, the representative phase detection circuit 59 selects the representative phase using the first phase group. That is, the representative phase detection circuit 59 outputs the phase number '7', being the central number of the phase numbers "6, 7, and 8", as the representative phase number.

In the example shown in FIG. 19, there is no phase number constituting the first phase group, and the phase numbers constituting the second phase group are "3, 4, 5, 6, 7, 8, 9, 10, and 11". Since there is no phase number in the first phase group, the representative phase detection circuit 59 selects the representative phase using the second phase group. That is, the representative phase detection circuit 59 outputs the phase number '7', being the central number of the phase numbers "3, 4, 5, 6, 7, 8, 9, 10, and 11", as the representative phase number.

As described above, according to the present embodiment, similarly to the first embodiment, even in the case where dispersion occurs in the histogram due to signal deterioration during transmission, it is possible to detect the real central phase in consideration of the shape of the histogram. As a result, it is possible to improve the accuracy of the phase adjustment of the clock signal. In particular, according to the present embodiment, two types of phase groups corresponding to two types of reference values are generated, and the representative phase is selected using either one of the phase groups. Therefore, the method of determining the representative phase is changed according to the histogram situation, so that it is possible to obtain an optimum representative phase number corresponding to the state of signal deterioration during transmission.

As described above, the clock regeneration circuit according to one embodiment of the present invention that generates a clock signal that is synchronized to an input signal includes a detection section, a histogram generation section, a calculation processing section, a phase adjustment section. The detection section detects the points at which the input signal transitions, a histogram generation section. The detection section corresponds to the edge extraction circuit 8 shown in FIG. 3. The histogram generation section associates a plurality of partial periods with the transition points, and generates a first histogram indicating the incidence of the transition points for each of the partial periods. The partial periods is generated by dividing a reference period of the clock signal. The histogram generation section corresponds to the AND gate block 9 and the edge number counting block 10 shown in FIG. 3. The calculation processing section generates a second histogram by calculation processing based on the first histogram, and calculates a phase adjustment value of the clock signal based on the second histogram. The calculation processing section corresponds to the histogram calculation circuit 11 shown in FIG. 3, the histogram calculation circuit 28 shown in FIG. 9, the histogram calculation circuit 44 shown in FIG. 12, or the histogram calculation circuit 51 shown in FIG. 17. The phase adjustment section adjusts the phase of the clock signal based on the phase adjustment value. The phase adjustment section corresponds to the clock phase adjustment circuit 12 shown in FIG. 3.

According to the above-described structure, the second histogram is generated by performing calculation processing based on a first histogram, and the phase adjustment value for the clock signal is calculated based on the second histogram. As a result, it is possible to obtain an effect of improving the accuracy of the phase adjustment of a clock signal.

Above is a detailed description of the embodiments of the present invention with reference to the drawings. However, specific constructions are not limited to the above-described embodiments, and any design change or the like that does not depart from the gist of the present invention is also included.

What is claimed is:

1. A clock regeneration circuit that generates a clock signal that is synchronized to an input signal, comprising:
   a detection section which detects points at which the input signal transitions;
   a histogram generation section which associates a plurality of partial periods with the transition points, and generates a first histogram indicating an incidence of the transition points for each of the partial periods, the partial periods being generated by dividing a reference period of the clock signal;
   a calculation processing section which extracts a portion of the partial periods from the partial periods constituting the first histogram based on the incidence of the transition points, the calculation processing section generating a second histogram indicating the incidence of the transition points only for each of the portion of the partial periods, and the calculation processing section calculating a phase adjustment value of the clock signal based on a temporal location of the partial period corresponding to a center of a temporal range, among the portion of the partial periods constituting the second histogram; and
   a phase adjustment section which adjusts a phase of the clock signal based on the phase adjustment value.

2. The clock regeneration circuit according to claim 1, wherein the calculation processing section extracts the portion of the partial periods from the partial periods constituting the first histogram in descending order of the incidence of the transition points.

3. The clock regeneration circuit according to claim 2, wherein the calculation processing section calculates the phase adjustment value for the clock signal based on the temporal location of the partial period corresponding to the center of the temporal range, among the partial periods constituting the second histogram, and a temporal location of the partial period where the incidence of the transition points reaches its maximum, among the partial periods constituting the first histogram.

4. The clock regeneration circuit according to claim 1, wherein the calculation processing section extracts the portion of the partial periods where the incidence of the transition points is greater than or equal to a reference value, or less than or equal to a reference value, from the partial periods constituting the first histogram.

5. The clock regeneration circuit according to claim 1, wherein the calculation processing section:
   extracts the portion of the partial periods where the incidence of the transition points is greater than or equal to a first reference value from the partial periods constituting the first histogram, and
   generates the second histogram indicating the incidence of the transition points only for each of the portion of the partial periods;
   extracts a portion of the partial periods where the incidence of the transition points is greater than or equal to a second reference value which is less than the first reference value from the partial periods constituting the first histogram, and
   generates a third histogram indicating the incidence of the transition points only for each of the portion of the partial periods; and
   calculates the phase adjustment value for the clock signal based on a temporal location of the partial period corresponding to a center of a temporal range, among the portion of the partial periods constituting the second histogram, or a temporal location of the partial period corresponding to a center of a temporal range, among the portion of the partial periods constituting the third histogram.

6. A clock regeneration circuit that generates a clock signal that is synchronized to an input signal, comprising
   a detection section which detects points at which the input signal transitions;
   a histogram generation section which associates a plurality of partial periods with the transition points, and generates a first histogram indicating an incidence of the transition points for each of the partial periods, the partial periods being generated by dividing a reference period of the clock signal;
   a calculation processing section which generates a second histogram by adding the incidence of the transition points of each of two adjacent partial periods to the incidence of the transition points of one partial period, for each of the partial periods constituting the first histogram, the two adjacent partial periods being adjacent to the one partial period in terms of time, the one period being one of the partial periods constituting the first histogram and the calculation processing section calculating a phase adjustment value of the clock signal based on a temporal location of the partial period in which the added incidence of the transition points reaches its maximum in the second histogram; and
   a phase adjustment section which adjusts a phase of the clock signal based on the phase adjustment value.

7. The clock regeneration circuit according to claim 6, wherein the calculation processing section generates the second histogram by adding only the incidence of the transition points of each of the two adjacent partial periods to the incidence of the transition points of the one partial period, for each of the partial periods constituting the first histogram.

8. A clock regeneration circuit that generates a clock signal that is synchronized to an input signal, comprising:
   detection means for detecting points at which the input signal transitions;
   histogram generation means for associating a plurality of partial periods with the transition points, and generating a first histogram indicating an incidence of the transition points for each of the partial periods, the partial periods being generated by dividing a reference period of the clock signal;
   calculation processing means for extracting a portion of the partial periods from the partial periods constituting the first histogram based on the incidence of the transition points, the calculation processing means generating a second histogram indicating the incidence of the transition points only for each of the portion of the partial periods, and the calculation processing section calculating a phase adjustment value of the clock signal based on a temporal location of the partial period corresponding to a center of temporal range, among the portion of the partial periods constituting the second histogram; and
   phase adjustment means for adjusting a phase of the clock signal based on the phase adjustment value.

9. The clock regeneration circuit according to claim 8, wherein the calculation processing means extracts the portion of the partial periods from the partial periods constituting the first histogram in descending order of the incidence of the transition points.

10. The clock regeneration circuit according to claim 9, wherein the calculation processing means calculates the phase adjustment value for the clock signal based on the temporal location of the partial period corresponding to the center of the temporal range, among the partial periods constituting the second histogram, and a temporal location of the partial period where the incidence of the transition points reaches its maximum, among the partial periods constituting the first histogram.

11. The clock regeneration circuit according to claim 8, wherein the calculation processing means extracts the portion of the partial periods where the incidence of the transition points is greater than or equal to a reference value, or less than or equal to a reference value, from the partial periods constituting the first histogram.

12. The clock regeneration circuit according to claim 8, wherein the calculation processing means:
   extracts the portion of the partial periods where the incidence of the transition points is greater than or equal to a first reference value from the partial periods constituting the first histogram and
   generates the second histogram indicating the incidence of the transition points only for each of the portion of the partial periods;
   extracts a portion of the partial periods where the incidence of the transition points is greater than or equal to a second reference value which is less than the first reference value from the partial periods constituting the first histogram, and
   generates a third histogram indicating the incidence of the transition points only for each of the portion of the partial periods; and
   calculates the phase adjustment value for the clock signal based on a temporal location of the partial period corresponding to a center of a temporal range, among the portion of the partial periods constituting the second histogram, or a temporal location of the partial period corresponding to a center of a temporal range, among the portion of the partial periods constituting the third histogram.

13. A clock regeneration circuit that generates a clock signal that is synchronized to an input signal, comprising
   detection means for detecting points at which the input signal transitions;
   histogram generation means for a associating a plurality of partial periods with the transition points, and generating a first histogram indicating an incidence of the transition points for each of the partial periods, the partial periods being generated by dividing a preference period of the clock signal;

calculation processing means for generating a second histogram by adding the incidence of the transition points of each of two adjacent partial periods to the incidence of the transition points of one partial period, for each of the partial periods constituting the first histogram, the two adjacent partial periods being adjacent to the one partial period in terms of time, the one period being one of the partial periods constituting the first histogram, and the calculation processing means calculating a phase adjustment value of the clock signal based on a temporal location of the partial period in which the added incidence of the transition points reaches its maximum in the second histogram; and phase adjustment for adjusting a phase of the clock signal based on the phase adjustment value.

14. The clock regeneration circuit according to claim 13, wherein the calculation processing means generates the second histogram by adding only the incidence of the transition points of each of the two adjacent partial periods to the incidence of the transition points of the one partial period, for each of the partial periods constituting the first histogram.

15. A clock regeneration method for generating a clock signal that is synchronized to an input signal, comprising:

detecting points at which the input signal transitions;

associating a plurality of partial periods with the transition points, and generating a first histogram indicating an incidence of the transition points for each of the partial periods, the partial periods being generated by dividing a reference period of the clock signal;

extracting a portion of the partial periods from the partial periods constituting the first histogram based on the incidence of the transition points, generating a second histogram indicating the incidence of the transition points only for each of the portion of the partial periods, and calculating a phase adjustment value of the clock signal based on a temporal location of the partial period corresponding to a center of a temporal range, among the portion of the partial periods constituting the second histogram; and adjusting a phase of the clock signal based on the phase adjustment value.

16. The clock regeneration method according to claim 15, wherein extracting the portion of the partial periods includes:

extracting the portion of the partial periods from the partial periods constituting the first histogram in descending order of the incidence of the transition points.

17. The clock regeneration method according to claim 16, wherein calculating the phase adjustment value includes calculating the phase adjustment value for the clock signal based on the temporal location of the partial period corresponding to the center of the temporal range, among the partial periods constituting the second histogram, and a temporal location of the partial period where the incidence of the transition points reaches its maximum, among the partial periods constituting the first histogram.

18. The clock regeneration method according to claim 15, wherein extracting the portion of the partial periods includes:

extracting the partial periods where the incidence of the transition points is greater than or equal to a reference value, or less than or equal to a reference value, from the partial periods constituting the first histogram.

19. The clock regeneration method according to claim 15, wherein extracting the portion of the partial periods, generating the second histogram and calculating the phase adjustment value includes:

extracting the portion of the partial periods where the incidence of the transition points is greater than or equal to a first reference value from the partial periods constituting the first histogram, and generating the second histogram indicating the incidence of the transition points only for each of the portion of the partial periods;

extracting a portion of the partial periods where the incidence of the transition points is greater than or equal to a second reference value which is less than the first reference value from the partial periods constituting the first histogram, and generating a third histogram indicating the incidence of the transition points only for each of the portion of the partial periods; and calculating the phase adjustment value for the clock signal based on a temporal location of the partial period corresponding to a center of a temporal range, among the portion of the partial periods constituting the second histogram, or a temporal location of the partial period corresponding to a center of a temporal range, among the portion of the partial periods constituting the third histogram.

20. A clock regeneration method for generating a clock signal that is synchronized to an input signal, comprising:

detecting points at which the input signal transitions;

associating a plurality of partial periods with the transition points, and generating a first histogram indicating an incidence of the transition points for each of the partial periods, the partial periods being generated by dividing a reference period of the clock signal;

generating a second histogram by adding the incidence of the transition points of each of two adjacent partial periods to the incidence of the transition points of one partial period, for each of the partial periods constituting the first histogram, the two adjacent partial periods being adjacent to the one partial period in terms of time, the one period being one of the partial periods constituting the first histogram, , and calculating a phase adjustment value of the clock signal based on a temporal location of the partial period in which the added incidence of the transition points reaches its maximum in the second histogram; and adjusting a phase of the clock signal based on the phase adjustment value.

21. The clock regeneration method according to claim 20, wherein generating the second histogram includes generating the second histogram by adding only the incidence of the transition points of each of the two adjacent partial periods to the incidence of the transition points of the one partial period, for each of the partial periods constituting the first histogram.

* * * * *